United States Patent [19]
Arai

[11] Patent Number: 5,612,568
[45] Date of Patent: Mar. 18, 1997

[54] LOW-NOISE ZENER DIODE

[75] Inventor: Takao Arai, Tokyo, Japan

[73] Assignee: NEC Corporation, Japan

[21] Appl. No.: 560,190

[22] Filed: Nov. 21, 1995

[30] Foreign Application Priority Data

Nov. 22, 1994 [JP] Japan .................................. 6-287740

[51] Int. Cl.$^6$ ................................................ H01L 29/861
[52] U.S. Cl. ........................ 257/481; 257/483; 257/490; 257/551; 257/603; 257/605; 257/606; 257/653
[58] Field of Search ..................... 257/481, 483, 257/484, 490, 492, 493, 494, 495, 551, 603, 605, 606, 653

[56] References Cited

U.S. PATENT DOCUMENTS 5,336,924  8/1994  Quint ...................................... 257/603

FOREIGN PATENT DOCUMENTS 62-43184  2/1987  Japan .

*Primary Examiner*—Minh-Loan Tran
*Attorney, Agent, or Firm*—Hayes, Soloway, Hennessey, Grossman & Hage, P.C.

[57] ABSTRACT

A low-noise Zener diode that enables to improve the surge resistance performance without degeneration of its low-noise characteristic is provided. The diode contains a semiconductor substrate of a first conductivity type and a first impurity doped region of a second conductivity type formed in a surface area of the substrate. The first impurity doped region has spaces into which no impurity of the second conductivity type is doped. The diode further contains a second impurity doped region of the second conductivity type formed in the first impurity doped region. The second impurity doped region has a depth less than that of the first impurity doped region. The second impurity doped region is contacted with the substrate in the spaces, producing main p-n junctions of the diode at respective interfaces of the second impurity doped regions and the substrate. The second impurity doped region is contacted with the first impurity doped region other than in the spaces. Heat generation zones of the main p-n junctions are combined with each other to produce a total heat generation zone that is greater than a sum area of the main p-n junctions.

16 Claims, 8 Drawing Sheets

LOW-NOISE ZENER DIODE

BACKGROUND OF THE INVENTION

1. Field of the Invention

The present invention relates to a Zener diode and more particularly, to a low-noise Zener diode applicable to voltage reference, which provides an improved surge resistance performance.

2. Description of the Prior Art

A conventional low-noise Zener diode is shown in FIG. 1, in which a p-type diffusion region 22 with a circular plan shape is formed in a surface area of an n-type semiconductor substrate 21. The diffusion region 22 serves as a guard ring.

A $p^+$-type diffusion region 23 is formed in the surface area of the substrate 21 so as to overlap with the inner part of the guard ring 22. The diffusion region 23 is positioned within an outer boundary line 22a of the guard ring 22. The central bottom face of the diffusion region 23, which is positioned within an inner boundary line 22b of the guard ring 22, is exposed from the guard ring 22, producing a p-n junction 27 at the interface of the region 23 and the substrate 21. The p-n junction 27 has a circular plan shape and a specified reverse breakdown voltage.

A silicon dioxide ($SiO_2$) film 24 having a window 24a is formed on the surface of the substrate 21. The window 24a is positioned on the $p^+$-type diffusion region 23 so as to expose the top face of the region 23.

An anode electrode 25 is formed so as to be in contact with the $p^+$-type diffusion region 23 through the window 24a. A cathode electrode 26 is formed on the back of the substrate 21.

In the conventional Zener diode shown in FIG. 1, a breakdown current flows through the p-n junction 27 due to its Zener breakdown during operation. As shown in FIG. 2, the level of noise generated from the diode decreases or increases with the increasing breakdown current density.

The noise level of the diode is comparatively low in the middle region B. Therefore, this region B is termed the "low-noise region".

The noise level increases abruptly with the decreasing breakdown current density in the region A whose breakdown current density value is lower than that of the region B. Such noise-level change is caused by shot noises which are due to the fact that the Zener breakdown phenomenon does not take place uniformly at the entire p-n junction 27. Therefore, the region A is termed the "shot noise region".

The noise level increases gradually with the increasing breakdown current density in the region C whose breakdown current density value is greater than that of the region B. Such noise-level change is caused by thermal noise, which is due to the heat generation at the p-n junction 27 because of the excessively high level of the breakdown current density. Therefore, the region C is termed the "thermal noise region".

The size or diameter $D_1$ of the p-n junction 27 is designed in consideration of the noise characteristic of the diode shown in FIG. 2. Specifically, to ensure that the diode operates in the low-noise region B, in other words, to ensure that the breakdown phenomenon takes place uniformly over the entire p-n junction 27, when the breakdown current is within the practical value range (for example, several milliamperes), the diameter D1 is usually designed to be short such as 30 to 60 µm.

In the conventional Zener diode shown in FIG. 1, since the p-n junction 27 is necessarily designed to be short for shot-noise reduction purposes or low-noise operation purposes, a problem that an obtainable surge resistance performance of the diode becomes lower than that of the popular voltage reference diodes occurs. Therefore, this conventional Zener diode cannot be employed for large surge applications in which a large current and/or voltage surge tends to occur.

To solve this problem, another conventional low-noise Zener diode shown in FIGS. 3 and 4 was developed, which was disclosed in the Japanese Non-Examined Patent Publication No. 62-43184 published in February 1987.

The conventional diode of FIGS. 3 and 4 is the same in structure as that of FIG. 1 except for resistor regions 28a and 28b. Each of the regions 28a and 28b is made of an n-type diffusion region and is the same in area or size as each other. Therefore, the description regarding to the same structure is omitted here by adding the same reference numerals to the corresponding elements for the sake of simplification.

As shown in FIGS. 3 and 4, the outer resistor regions 28a and the inner resistor regions 28b are formed in the $p^+$-type diffusion region 23 with circular plan shape. The outer resistor regions 28a are arranged at regular intervals along an outer circle concentric with the circular region 23. The inner resistor regions 28b are arranged at regular intervals along an inner circle concentric with the outer circle. The arrangement density or pitch of the outer resistor regions 28a is higher than that of the inner resistor regions 28b. In other words, the arrangement density or pitch of the resistor regions 28a and 28b increases with increasing distance from the center of the diffusion region 23.

With the conventional Zener diode of FIG. 1, breakdown current tends to flow only through the periphery of the p-n junction 27 and consequently, the heat generation tends to concentrate at the periphery of the junction 27. On the other hand, in the conventional Zener diode of FIGS. 3 and 4, because the resistor regions 28a and 28b are formed in the diffusion region 23, the breakdown current uniformly can flow through the entire p-n junction 27 even when the breakdown current is within the practical value range (for example, several milliamperes).

Accordingly, heat generation is dispersed over the entire p-n junction 27 in operation, which permits the the surge resistance performance to be improved.

However, the conventional Zener diode of FIGS. 3 and 4 has the following problem:

In the conventional Zener diode of FIGS. 3 and 4, similar to the conventional Zener diode of FIG. 1, the diameter $D_1$ of the p-n junction 27 cannot be enlarged because such diameter enlargement causes increases in shot noises due to decreases in breakdown current density.

Therefore, if a large surge current and/or voltage is applied across the anode and cathode electrodes 24 and 26 so as to generate heat at the entire p-n junction 27, the conventional Zener diode of FIGS. 3 and 4 cannot withstand such surge current and/or voltage.

SUMMARY OF THE INVENTION

Accordingly, an object of the present invention is to provide a low-noise Zener diode having improved the surge resistance performance without degeneration of its low-noise characteristic.

A low-noise Zener diode according to a first aspect of the present invention contains a semiconductor substrate of a first conductivity type and a first impurity doped region of a second conductivity type formed in a surface area of the substrate. The first impurity doped region has spaces into which no impurity of the second conductivity type is doped.

The diode further contains a second impurity doped region of the second conductivity type formed in the first impurity doped region. The second impurity doped region has a depth less than that of the first impurity doped region.

The second impurity doped region is contacted with the substrate in the spaces, producing main p-n junctions of the diode at an interface of the second impurity doped region and the substrate. The second impurity doped region is contacted with the first impurity doped region other than in the spaces.

In the Zener diode according to the first aspect of the invention, since the main p-n junctions are formed in the spaces of the first impurity doped region, a breakdown phenomenon simultaneously occurs at the main p-n junctions under application of a surge voltage and/or current. Therefore, the main p-n junctions start to generate heat due to the surge.

Although the heat generation (or heat source) zones of the main p-n junctions are initially in accordance with the areas of the main p-n junctions, respectively, they gradually and laterally expand with increasing surge application time so as to be combined with each other. As a result, the total heat generation zone of the main p-n junctions can be expanded so as to be greater than the sum area of the main p-n junctions, without increasing the areas of the main p-n junctions. This means that the surge resistance performance of the diode can be improved without degeneration of its low-noise characteristic.

A low-noise Zener diode according to a second aspect of the present invention contains a semiconductor substrate of a first conductivity type and a semiconductor layer of the first conductivity type formed on the substrate. The layer is lower in doping concentration than the substrate.

The diode further contains a first impurity doped region of a second conductivity type formed in a surface area of the layer. The first impurity doped region has a depth less than the thickness of the layer.

The diode further contains second impurity doped regions of the second conductivity type formed so as to vertically penetrate the first impurity doped region and the layer. Each of the second impurity doped regions has a top exposed from the first impurity doped region and a bottom contacted with the substrate. The second impurity doped regions produce main p-n junctions at an interface of the second impurity doped region and the substrate.

In the Zener diode according to the second aspect of the invention, since the bottoms of the second impurity doped regions of the second conductivity type are contacted with the substrate of the first conductivity type to produce the main p-n junctions at their interface, a breakdown phenomenon simultaneously occurs at the main p-n junctions under application of a surge voltage and/or current. Therefore, the main p-n junctions start to generate heat due to the surge.

In the same way as that of the first aspect, the heat generation areas of the main p-n junctions are combined with each other, and as a result, their total heat generation area can be expanded so as to be greater than the sum area of the main p-n junctions, without increasing the areas of the main p-n junctions. Accordingly, the surge resistance performance of the diode according to the second aspect also can be improved without degeneration of its low-noise characteristic.

The Zener diode according to the second aspect has an additional advantage of a lower operating resistance than the case of the first aspect.

DETAILED DESCRIPTION OF THE PREFERRED EMBODIMENTS

Preferred embodiments of the present invention will be described below while referring to the attached drawings.

FIRST EMBODIMENT

Figure 5:
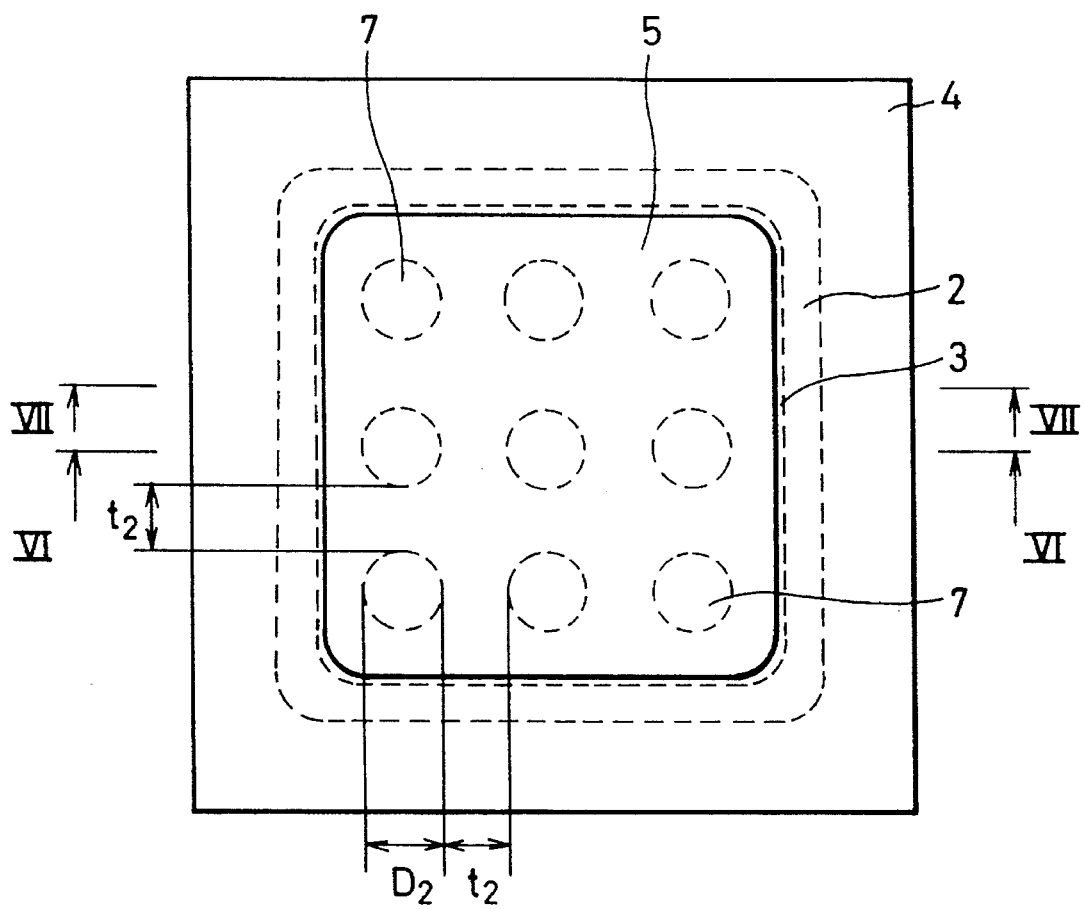
FIG. 5 is a partial plan view of a Zener diode according to a first embodiment of the invention.
Figure 6:
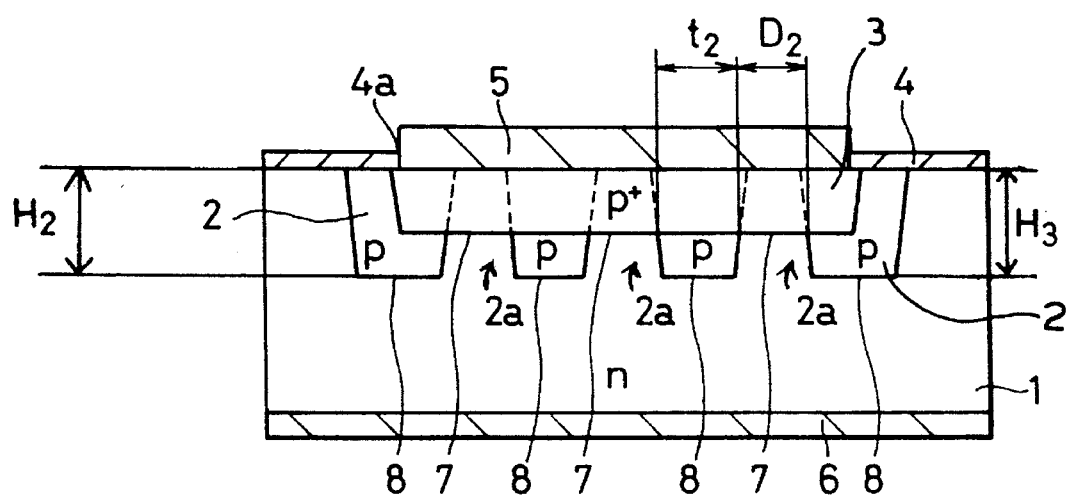
FIG. 6 is a partial cross-sectional view of the Zener diode according to the first embodiment along the line VI—VI in FIG. 5.
Figure 7:
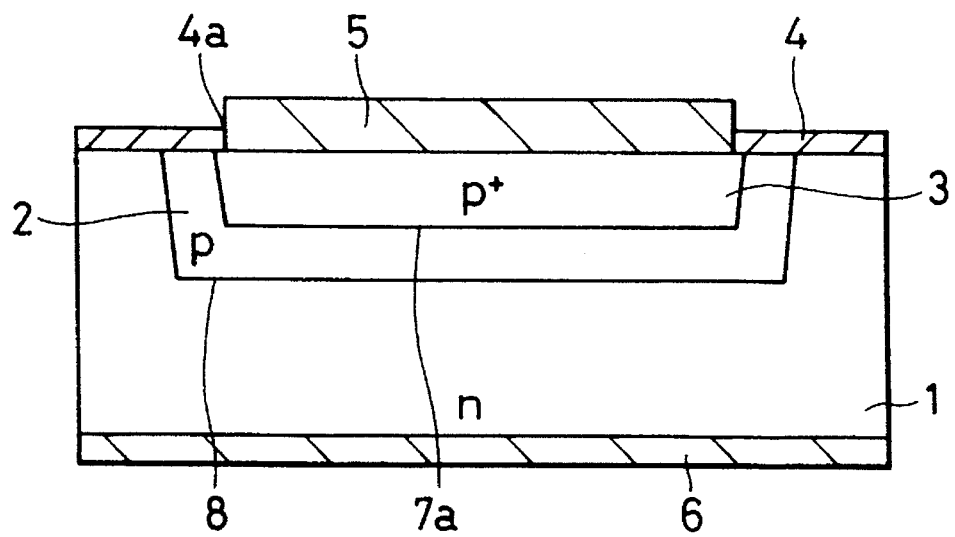
FIG. 7 is a partial cross-sectional view of the Zener diode according to the first embodiment along the line VII—VII in FIG. 5.

A low-noise Zener diode according to a first embodiment has a configuration as shown in FIGS. 5, 6 and 7, in which a p-type diffusion region 2 with a square plan shape is formed in a surface area of an n-type silicon substrate 1. The diffusion region 2 has nine spaces 2a into which no p-type impurity is doped. Here, the nine spaces 2a are arranged in a matrix array having three rows and three columns. Each of the spaces 2a has a shape of an approximately circular tube or pipe. In other words, each of the spaces 2a is like an opening or hole vertically penetrating the region 2.

A P$^+$-type diffusion region 3 with a square plan shape is formed within the p-type diffusion region 2. The p$^+$-type region 3 is greater in doping concentration than the p-type region 2. The p$^+$-type region 3 is slightly smaller in plan shape than the p-type region 2, as shown in FIG. 5. The p$^+$-type region 3 has a depth $H_3$ less than depth $H_2$ of the p-type region 2, as shown in FIGS. 6 and 7.

Since the p$^+$-type diffusion region 3 is formed so as to entirely overlap with the p-type region 2 having the spaces 2a, the p$^+$-type region 3 is partially exposed from the p-type region 2 in order to be contacted with the n-type substrate 1 in the spaces 2a. Thus, as clearly shown in FIG. 6, nine main p$^+$-n junctions 7 of the diode are produced in the spaces 2a at an interface of the p$^+$-type region 3 and the n-type substrate 1.

The p$^+$-n junctions 7 are arranged in the same matrix array as that of the spaces 2a. Each of the junctions 7 has a diameter $D_2$. Intervals of the adjacent junctions 7 or the spaces 2a in each row and each column are equal to be $t_2$.

The p$^+$-type region 3 is contacted with the p-type region 2 other than in the spaces 2a. Thus, as clearly shown in FIG. 7, a p-n junction 8 is produced outside the spaces 2a at an interface of the p-type region 2 and the substrate 1.

The p$^+$-n junctions 7 are smaller in reverse breakdown voltage than the p-n junction 8, because the p$^+$-type diffusion region 3 is greater in doping concentration than the p-type diffusion region 2.

A silicon dioxide (SiO$_2$) film 4 having a square window 4a is formed on the surface of the substrate 1 to cover the p-type region 2. The window 4a is positioned right over the p$^+$-type diffusion region 3, exposing substantially the entire top face of the region 3 therefrom.

An anode electrode 5 is formed so as to be contacted with the p$^+$-type diffusion region 3 through the window 4a. A cathode electrode 6 is formed on the back of the substrate 1.

Figure 8:
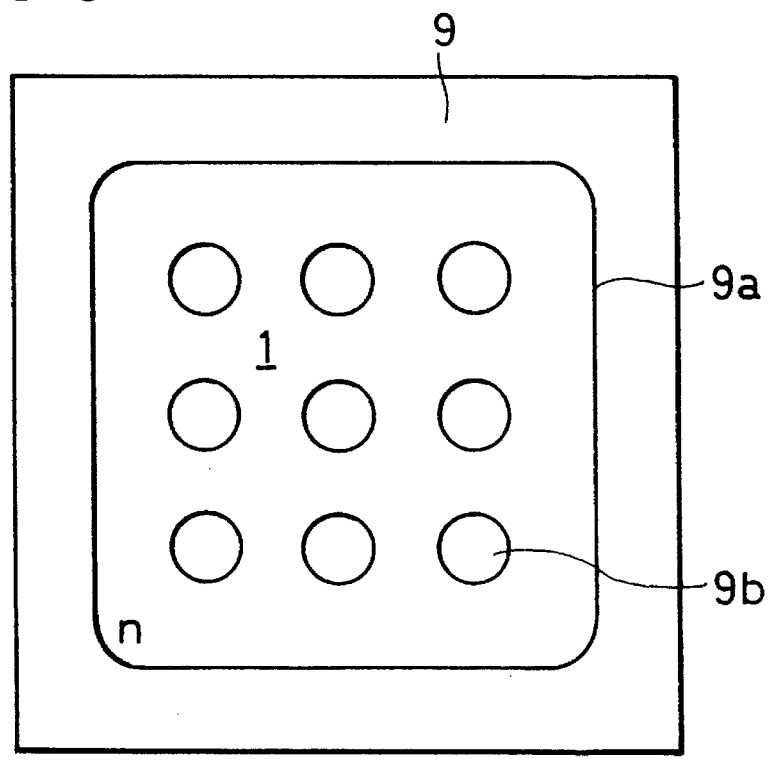
FIG. 8 is a partial plan view of the Zener diode according to the first embodiment, showing its fabrication process sequence.

The low-noise Zener diode according to the first embodiment having the above-described configuration is fabricated through the following process sequence:

First, the n-type silicon substrate 1 is thermally oxidized to form an SiO$_2$ film 9 on its surface. The film 9 is then selectively etched to produce a square window 9a, as shown in FIG. 8. The window 9a defines the outer boundary line of the p-type diffusion region 2. Nine SiO$_2$ islands 9b with circular plan shapes are left in the window 9a, which are arranged in a corresponding matrix array to that of the p$^+$-n junctions 7. The islands 9b define the respective p$^+$-n junctions 7.

Next, using the patterned SiO$_2$ film 9 as a mask, a p-type impurity such as boron (B) is selectively and thermally diffused into the substrate 1 at 1150° C. for 15 minutes, and then annealed at 1250° C. for three to ten hours. Thus, the p-type diffusion region 2 is formed in the surface area of the substrate 1, as shown in FIGS. 6 and 7. The nine circular spaces 2a where the boron is not doped are formed in the region 2 at the corresponding positions to the remaining SiO$_2$ islands 9b, respectively.

Figure 1:
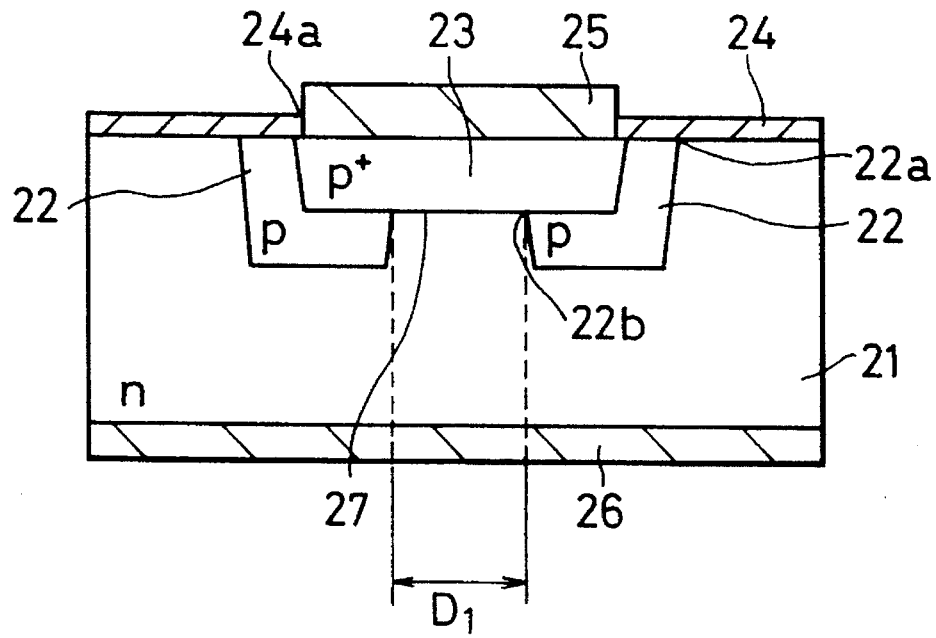
FIG. 1 is a partial cross-sectional view of a conventional Zener diode.
Figure 2:
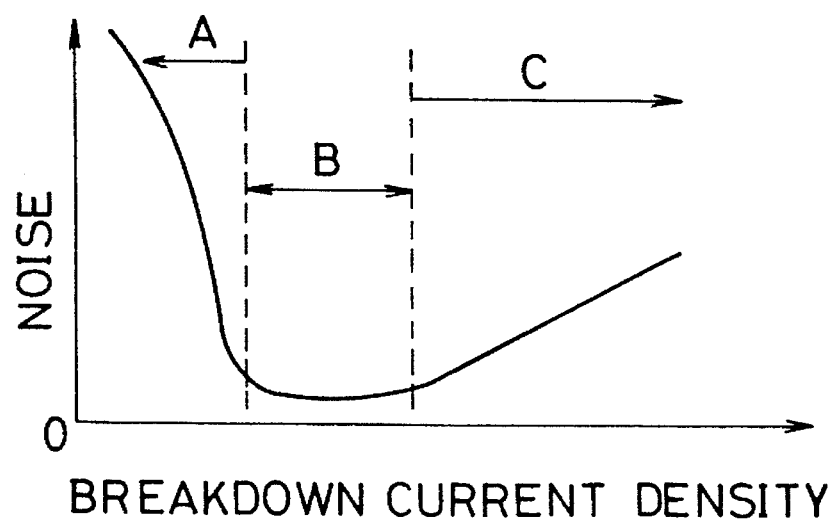
FIG. 2 is a graph showing a relationship between the breakdown current density and the noise of the conventional Zener diode of FIG. 1.
Figure 3:
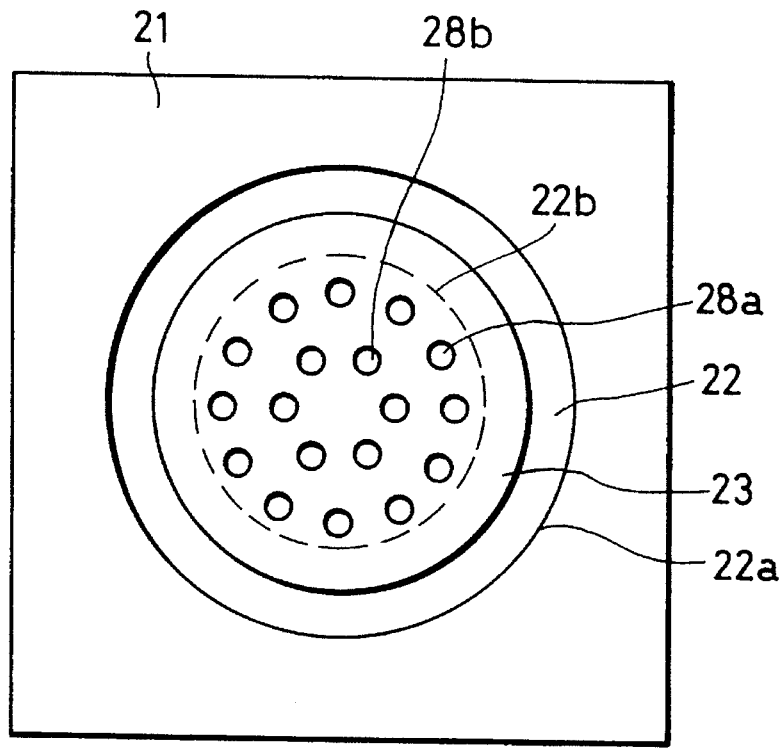
FIG. 3 is a partial plan view of another conventional Zener diode, in which an $SiO_2$ film and an anode electrode both of which are formed on a semiconductor substrate are omitted.

The doping concentration of the p-type diffusion region 2 may be the same as that of the p-type diffusion region 22 of the conventional Zener diode shown in FIG. 1.

Figure 9:
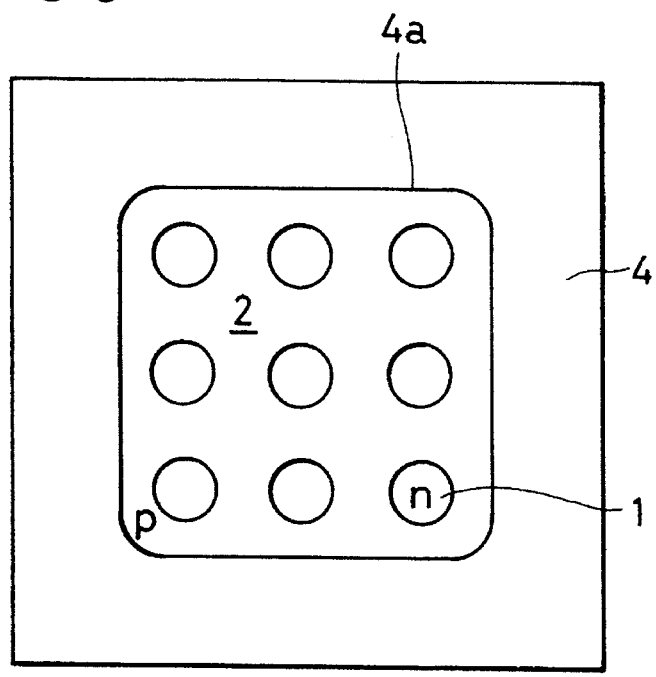
FIG. 9 is a partial plan view of the Zener diode according to the first embodiment, showing its fabrication process sequence.

The substrate 1 having the p-type diffusion region 2 is thermally oxidized again without removing the patterned SiO$_2$ film 9, forming the SiO$_2$ film 4 on the surface of the substrate 1. The film 4 is then selectively etched to remove the SiO$_2$ islands 9b, producing the square window 4a, as shown in FIG. 9. The window 4a defines the outer boundary line of the p$^+$-type diffusion region 3.

Using the patterned SiO$_2$ film 4 as a mask, a p-type impurity such as boron is selectively and thermally diffused into the substrate 1 at 1150° C. for 15 minutes, and then annealed at 1250° C. for several hours. Thus, the p$^+$-type diffusion region 3 is formed in the surface area of the substrate 1 to be shallower than the p-type diffusion region 2, as shown in FIGS. 6 and 7. The nine p$^+$-n junctions 7 are produced in the circular spaces 2a at the corresponding positions to the remaining SiO$_2$ islands 9b, respectively.

The doping concentration of the p$^+$-type diffusion region 3 may be the same as that of the p$^+$-type diffusion region 23 of the conventional Zener diode shown in FIG. 1.

Subsequently, a metal film such as aluminum (Al) is selectively formed so as to be contacted with the exposed surface area of the substrate 1 from the window 4a by a sputtering or evaporation process, producing the anode electrode 5. The anode electrode 5 is electrically connected to the p$^+$-type diffusion region 3.

Another metal film such as gold (Au) or silver (Ag) is formed on the back of the substrate 1 so as to be contacted therewith by an evaporation process, producing the cathode electrode 6. The cathode electrode 6 is electrically connected to the substrate 1.

Thus, the low-noise Zener diode according to the first embodiment is obtained.

In the Zener diode according to the first embodiment, since the main p$^+$-n junctions 7 are formed in the spaces 2a of the p-type diffusion region 2, breakdown phenomenon simultaneously occurs at the p$^+$-n junctions 7 under application of a surge voltage and/or current. Therefore, the p$^+$-n junctions 7 start to generate heat due to the surge.

Although the heat generation or heat source areas of the main p$^+$-n junctions 7 are initially in accordance with the areas of the junctions 7, respectively, they gradually and laterally expand with the increasing surge application time so as to be combined with each other. As a result, the total heat generation zone of the p$^+$-n junctions 7 can be expanded to be greater than the sum area of the junctions 7, without increasing the respective areas of the junctions 7. In other words, the total heat resistance of the junctions 7 decreases according to the increase in the total heat source area of the junctions 7. Such the heat resistance decrease leads to surge resistance increase.

On the other hand, the total area or size of the main p$^+$-n junctions 7 needs not to be increased, which prevents the noise level from rising.

Consequently, the surge resistance performance of this diode can be improved without degeneration of its low-noise characteristic.

For example, it is supposed that each p$^+$-n junction 7 has the diameter $D_2$ of 10 μm, the interval $t_2$ of 10 μm, and the depth of 3 μm. If a pulsed power surge with a pulse width of 1 μsec or longer is applied to the diode of FIGS. 5, 6 and 7 through the anode and cathode electrodes 5 and 6, heat generated at each junction 7 tends to laterally spread for 10 μm or more. In other words, the obtainable heat spreading zone of each junction 7 is 10 μm or more in diameter.

Thus, the heat spreading zones of the adjacent p$^+$-n junctions 7 are overlapped so as to be combined with each other, resulting in a single, total heat spreading zone. This means that an imaginary square area including all the junctions 7 can be considered to act as the total heat spreading zone. This imaginary square has a side of 50 μm and therefore, the combined heat spreading zones of the junctions 7, i.e., the total heat spreading zone, has an area or size of 2500 μm$^2$, because 50×50=2500.

On the other hand, the sum area of the junctions 7 is approximately 707 μm$^2$ because π×(10/2)$^2$×9≈707.

Accordingly, the total heat source zone of the junctions 7 is approximately equal to 3 and one half times the sum area of the junctions 7. In other words, the total thermal resistance of the junctions 7 is reduced to approximately (1/3.5). Consequently, the surge resistance performance of this Zener diode can be improved up to about 3.5 times compared with the cases of the conventional Zener diodes shown in FIGS. 1 and 4 where the heat source area of the p$^+$-n junction 27 is substantially equal to the area of the junction 27 itself.

In the first embodiment, nine p$^+$-n junctions 7 with the same circular plan shape are provided. However, the number and/or plan shape of the junctions 7 may be changed as required. The junctions 7 are not necessary to be arranged at regular intervals and they may be arranged in any pattern as required. The junctions 7 are not required to be the same in shape. It is preferred that the junctions 7 are arranged so that all the junctions 7 have substantially the same temperature due to the heat generated therefrom.

The thermal resistance decreases improve the surge resistance performance with the increasing area of the above imaginary square even if the area or size of each junction 7 is not changed.

To keep the low-noise characteristic, it is preferred that the total area of the junctions 7 is limited to 4000 μm$^2$ or less.

SECOND EMBODIMENT

Figure 10:
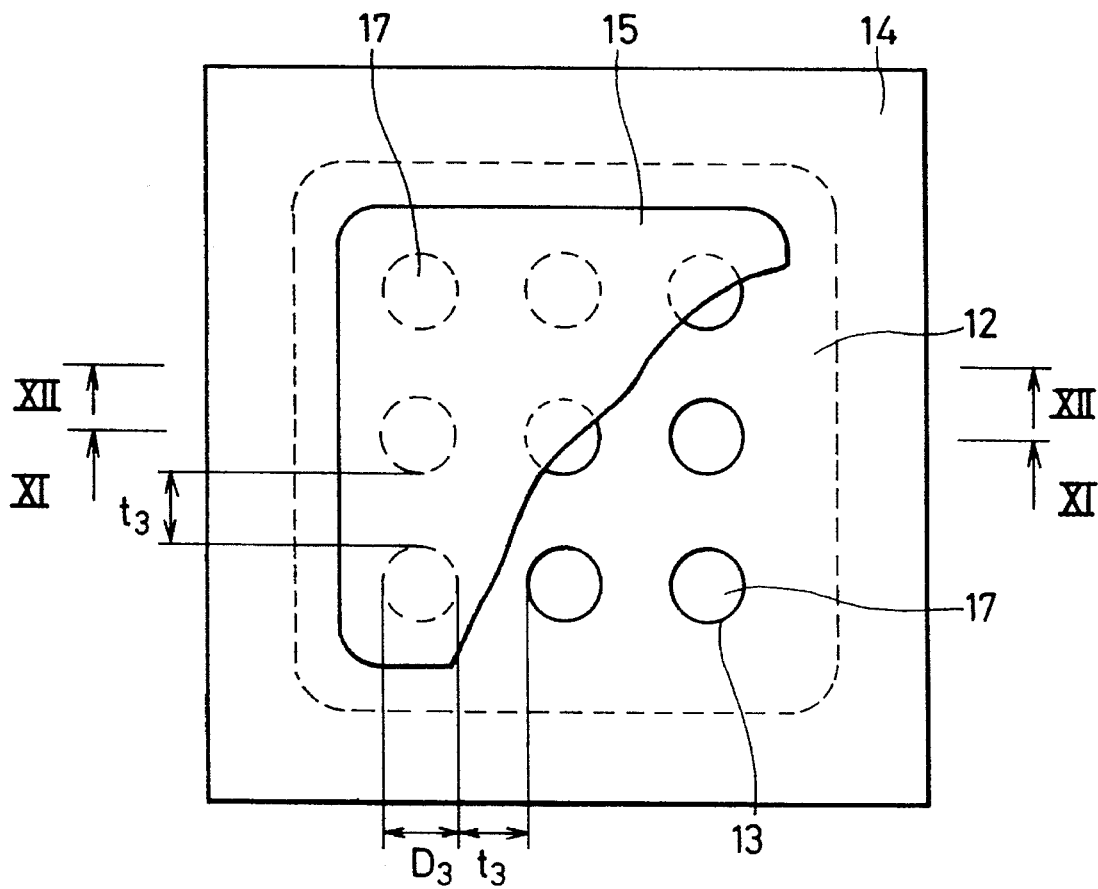
FIG. 10 is a partial plan view of a Zener diode according to a second embodiment of the invention, in which an anode electrode formed on a semiconductor substrate is partially cut away.
Figure 11:
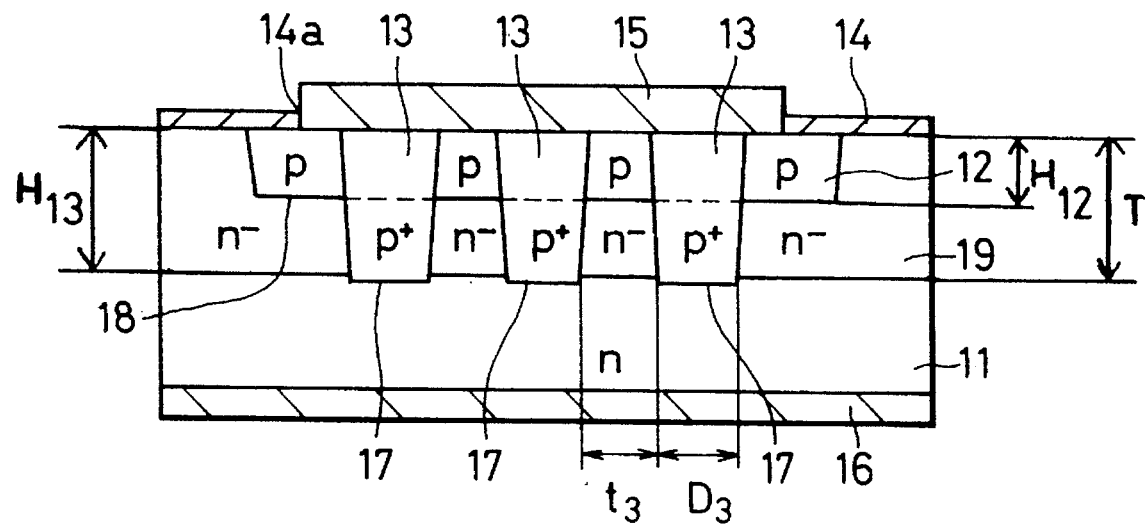
FIG. 11 is a partial cross-sectional view of the Zener diode according to the second embodiment along the line XI—XI in FIG. 10.
Figure 12:
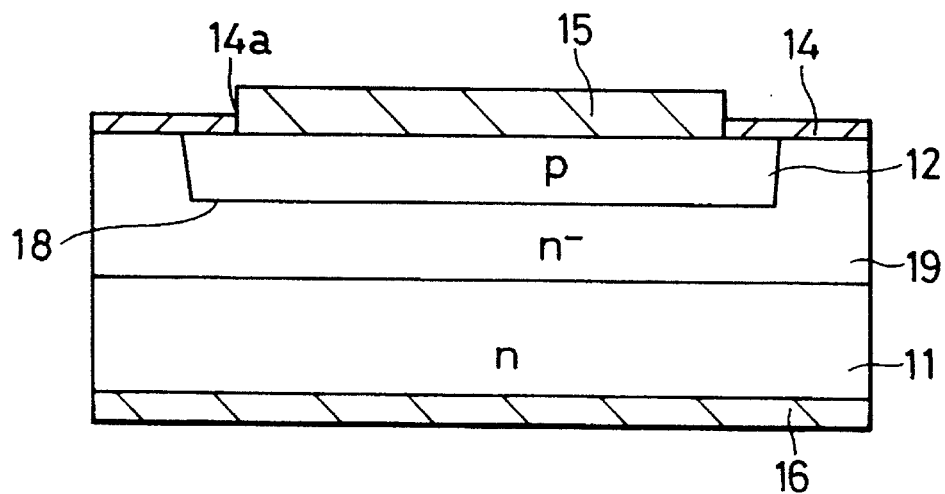
FIG. 12 is a partial cross-sectional view of the Zener diode according to the second embodiment along the line XII—XII in FIG. 10.

A low-noise Zener diode according to a second embodiment has a configuration as shown in FIGS. 10, 11 and 12, in which an n$^-$-type epitaxial layer 19 is formed on an n-type silicon substrate 11. The epitaxial layer 19 is lower in doping concentration than the substrate 11.

A p-type diffusion region 12 with a square plan shape is formed in a surface area of the epitaxial layer 19. The region 12 has a depth $H_{12}$ less than the thickness T of the layer 19.

Nine p$^+$-type diffusion regions 13 are formed so as to vertically penetrate the p-type region 12 and the underlaying epitaxial layer 19. Each of the p$^+$-type regions 13 has a shape of an approximately circular pillar whose top is exposed from the region 12 and whose bottom is contacted with the substrate 11. Regions 13 have a depth $H_{13}$ greater than the depth $H_{12}$ of the region 12 and the thickness T of the layer 19. Here, the nine diffusion regions 13 are arranged in a matrix array having three rows and three columns.

The p$^+$-type diffusion regions 13 produce main p$^+$-n junctions 17 of this diode at interfaces of the regions 13 and the substrate 11. The p$^+$-n junctions 17 are arranged in the same matrix array as that of the regions 13. Each of the junctions 17 has a diameter $D_3$. Intervals of the adjacent junctions 17 in each row and each column are equal to $t_3$.

Since the p$^+$-type diffusion regions 13 are formed to vertically penetrate the p-type region 12 and the underlying epitaxial layer 19, the p-type region 12 is contacted with the n$^-$-type layer 19 outside the regions 13. Thus, as clearly shown in FIG. 12, a p-n$^-$ junction 18 is produced at an interface of the region 12 and the layer 19.

The main p$^+$-n junctions 17 are smaller in reverse breakdown voltage than the p-n$^-$ junction 18, because the P$^+$-type diffusion regions 13 are greater in doping concentration than the p-type diffusion region 12 and the n-type substrate 11 is greater in doping concentration than the n$^-$-type epitaxial layer 19.

In this embodiment, only the bottoms of the p$^+$-type diffusion regions 13 are contacted with the n-type substrate 11 and the sides of the regions 13 are contacted with the n$^-$-type epitaxial layer 19. As a result, the breakdown phenomenon occurs at the junctions 17 prior to at the interfaces of the regions 13 and the layer 19.

An SiO$_2$ film 14 having a square window 14a is formed on the surface of the epitaxial layer 19 to over the p-type diffusion region 12. The window 14a is positioned right over the diffusion region 12, exposing the approximately entire top face of the region 12 therefrom. The tops of the p$^+$-type diffusion regions 13 also are exposed in the window 14a.

An anode electrode 15 is formed so as to be contacted with the p$^+$-type diffusion regions 13 and the p-type diffusion regions 12 through the window 14a. A cathode electrode 16 is formed on the back of the substrate 11.

Figure 13:
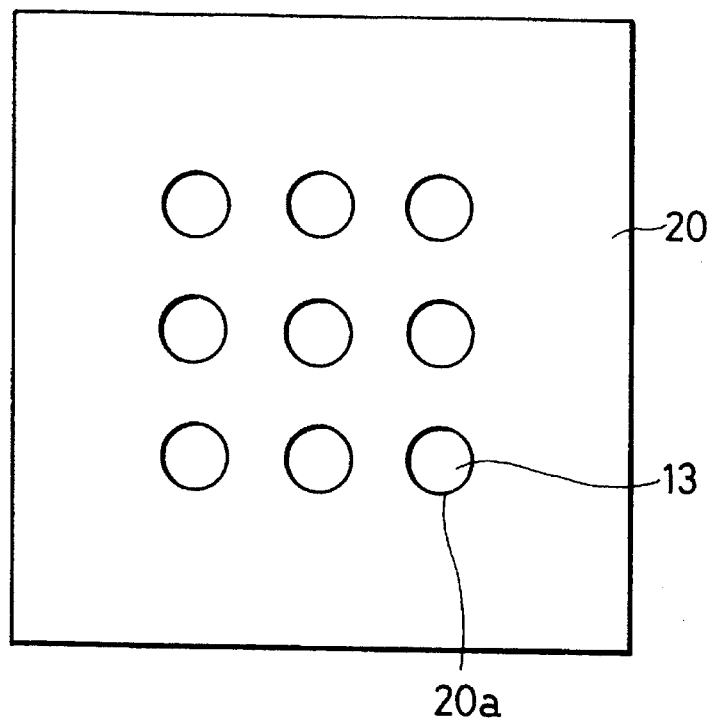
FIG. 13 is a partial plan view of the Zener diode according to the second embodiment, showing its fabrication process sequence.

The low-noise Zener diode according to the second embodiment having the above-described configuration is fabricated through the following process sequence:

First, the n$^-$-type epitaxial layer 19 is formed on the n-type silicon substrate 11. Then, the substrate 11 with the layer 19 is thermally oxidized to form an SiO$_2$ film 20 on the layer 19. The film 20 is then selectively etched to produce nine circular windows 20a, as shown in FIG. 13. The windows 20a, which are arranged in a corresponding matrix array to that of the p$^+$-n junctions 17, define the boundary lines of the p$^+$-type diffusion regions 13.

Next, using the patterned SiO$_2$ film 20 as a mask, a p-type impurity such as boron is selectively ion-implanted into the epitaxial layer 19 at an acceleration energy of several tens of keV with a dose in the order of 10$^{14}$ atoms/cm$^2$, and then annealed at 1140° C. for several hours. Thus, the p$^+$-type diffusion regions 13 are formed in the layer 19, as shown in FIGS. 10 and 11. The nine pillar-shaped regions 13 produce the p$^+$-n junctions 17 at positions corresponding to the windows 20a, respectively.

The doping concentration of the p$^+$-type diffusion regions 13 may be the same as that of the p$^+$-type diffusion region 23 of the conventional Zener diode shown in FIG. 1.

Figure 14:
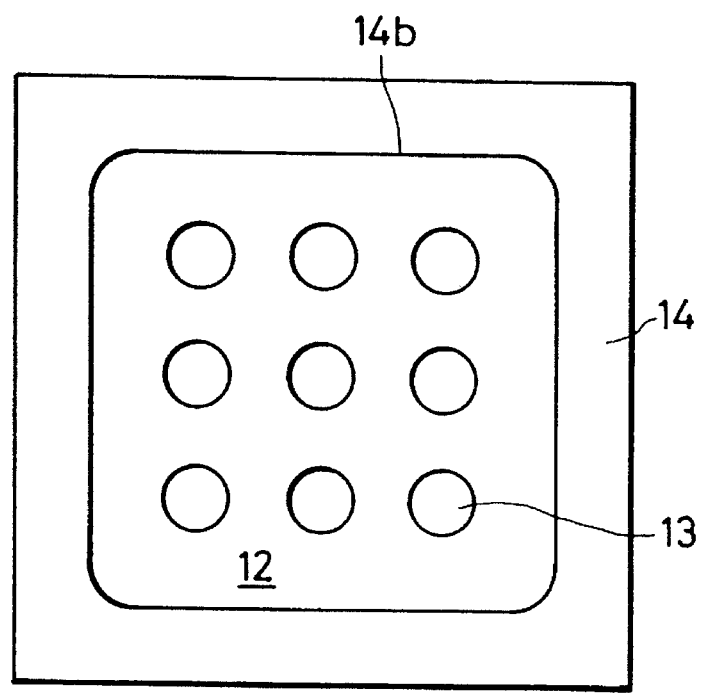
FIG. 14 is a partial plan view of the Zener diode according to the second embodiment, showing its fabrication process sequence.

The substrate 11 having the p$^+$-type diffusion regions 13 is thermally oxidized again without removing the patterned SiO$_2$ film 20, forming the SiO$_2$ film 14 on the epitaxial layer 19. The film 14 is then selectively etched to form a square window 14b, as shown in FIG. 14. The window 14b defines the outer boundary line of the p-type diffusion region 12.

Using the patterned SiO$_2$ film 14 as a mask, a p-type impurity such as boron is selectively ion-implanted into the epitaxial layer 19 at an acceleration energy of several tens of keV with a dose in the order to 10$^{13}$ atoms/cm$^2$, and then annealed at 1140° C. for several minutes. Thus, the p-type diffusion region 12 is formed in the surface area of the layer 19, as shown in FIGS. 11 and 12. The p-n$^-$ junction 18 is produced in the layer 19 outside the diffusion regions 13.

The doping concentration of the p-type diffusion region 12 may be the same as that of the p-type diffusion region 22 of the conventional Zener diode shown in FIG. 1.

Figure 15:
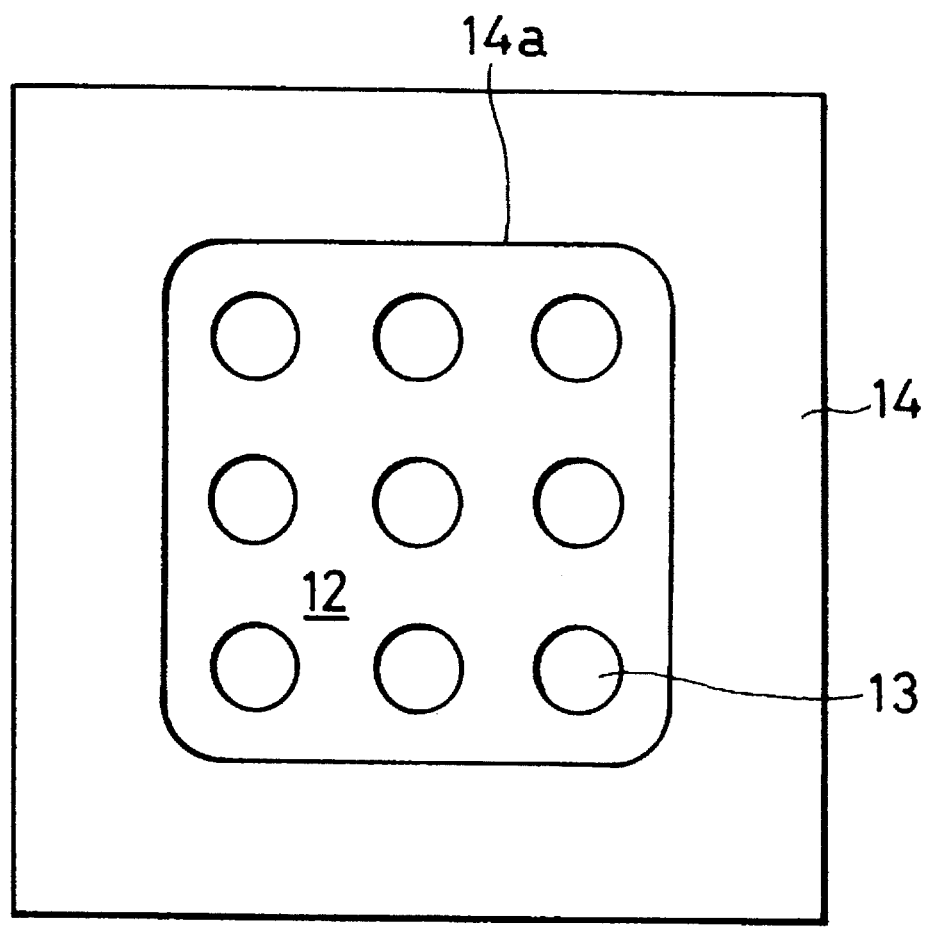
FIG. 15 is a partial plan view of the Zener diode according to the second embodiment, showing its fabrication process sequence.

Subsequently, the SiO$_2$ film 14 is then selectively etched to form the square window 14a wider than the window 14b, as shown in FIG. 15. The window 14a defines the outer boundary line of the anode electrode 15.

A metal film such as aluminum is selectively formed so as to be contacted with the exposed surface area of the epitaxial layer 19 from the window 14a by a sputtering or evaporation process, producing the anode electrode 15. The anode electrode 15 is electrically connected to the $p^+$-type diffusion regions 13 and the p-type diffusion region 12.

Another metal film such as gold or silver is formed on the back of the substrate 11 to be contacted therewith by an evaporation process, producing the cathode electrode 16. The cathode electrode 16 is electrically connected to the substrate 11.

Thus, the low-noise Zener diode according to the first embodiment is obtained.

With the Zener diode according to the second embodiment, since the main $p^+$-n junctions 17 are formed at the interfaces of the $p^+$-type diffusion regions 13 and the n-type substrate 11, breakdown phenomenon simultaneously occurs at the junctions 17 under application of a surge voltage and/or current. Therefore, the $p^+$-n junctions 17 start to generate heat due to the surge power.

Although the heat generation or heat source zones of the main $p^+$-n junctions 17 are initially in accordance with the areas of the junctions 17, respectively, they gradually and laterally expand with the increasing surge application time to be combined with each other. As a result, the total heat generation zone of the $p^+$-n junctions 17 can be expanded so as to be greater than the sum area of the junctions 17, without increasing the respective areas of the junctions 17.

On the other hand, the total area or size of the main $p^+$-n junctions 17 need not be increased.

Consequently, similar to the case of the first embodiment, the surge resistance performance of this diode can be improved without degeneration of its low-noise characteristic.

Supposing that each $p^+$-n junction 17 has the diameter $D_3$ of 10 μm, the interval $t_3$ of 10 μm, and the depth of 3 μm, similar to the case of the first embodiment, the total heat source zone of the junctions 17 is approximately equal to 3 and one half times the sum area of the junctions 17. In other words, the total thermal resistance of the junctions 17 is reduced to approximately (1/3.5).

Figure 4:
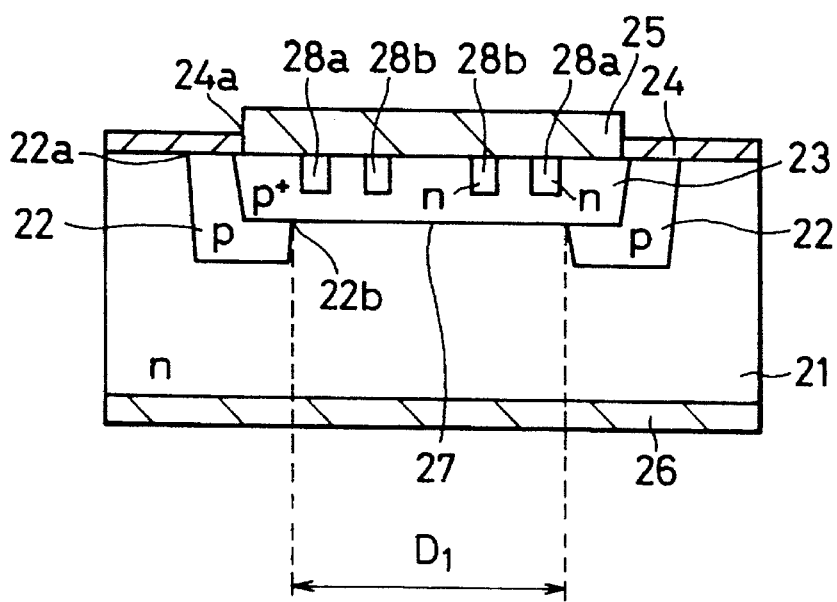
FIG. 4 is a partial cross-sectional view of the conventional Zener diode of FIG. 3.

Consequently, the surge resistance performance of this Zener diode can be improved up to about 3.5 times compared with the cases of the conventional Zener diodes shown in FIGS. 1 and 4.

The Zener diode of the second embodiment has the following additional advantage: Because the $p^+$-n junctions 17 are located at a deeper level than the bottom of the p-type diffusion region 12 or the p-n junction 18, a depletion region that will grow downward from the p-n junction 18 to the substrate 11 is not positioned in the breakdown current paths of the junctions 17. As a result, the operating electric resistance of this diode becomes lower than that of the first embodiment.

Also in the second embodiment, the nine $p^+$-n junctions 17 with the circular plan shape are provided. However, the number and/or plan shape of the junctions 17 may be changed as required. The junctions 17 may be arranged in any pattern as required and may be different in shape. It is preferred that the junctions 17 are arranged so that all the junctions 17 have substantially the same temperature due to the generated heat therefrom.

Similar to the case of the first embodiment, the thermal resistance decreases thereby improving surge resistance performance with the increasing area of the imaginary square even if the area or size of each junction 17 is not changed. To keep the low-noise characteristic, it is preferred that the total area of the junctions 17 is limited to 4000 μm$^2$ or less.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A low-noise Zener diode comprising:

a semiconductor substrate of a first conductivity type;

a first impurity doped region of a second conductivity type opposite to said first conductivity type, said first impurity doped region being formed in a surface area of said substrate;

said first impurity doped region having spaces into which no impurity of said second conductivity type is doped;

a second impurity doped region of said second conductivity type formed in said first impurity doped region, said second impurity doped region having a depth less than that of said first impurity doped region;

said second impurity doped region being contacted with said substrate in said spaces for producing a plurality of main p-n junctions of said diode at an interface of said second impurity doped region and said substrate;

said second impurity doped region being contacted with said first impurity doped region outside said spaces;

a first electrode electrically connected to said second impurity doped region; and a second electrode electrically connected to said substrate;

wherein heat generation zones of said plurality of main p-n junctions are combined with each other to produce a total heat generation zone that is greater than a sum area of said plurality of main p-n junctions.

2. A diode as claimed in claim 1, wherein each of said spaces of said first impurity doped region has a tubular shape that extends vertically.

3. A diode as claimed in claim 1, wherein each spaces of said first impurity doped region are arranged in a matrix array at intervals.

4. A low-noise Zener diode comprising:

a semiconductor substrate of a first conductivity type;

a plurality of impurity doped regions of a second conductivity type opposite to said first conductivity type, said plurality of impurity doped regions being formed in said substrate;

said plurality of impurity doped regions being arranged apart from each other and being in contact with said substrate for producing a plurality of main p-n junctions of said diode in a depth level at respective interfaces of said plurality of impurity doped regions and said substrate;

a first electrode electrically connected to said plurality of impurity doped regions; and a second electrode electrically connected to said substrate;

wherein each of said plurality of main p-n junctions have reverse breakdown voltages that are substantially equal to each other, thereby permitting breakdown phenomenon to take place at each of the plurality of main p-n junctions substantially simultaneously;

and also wherein heat generation zones of said plurality of main p-n junctions are combined with each other to produce a total heat generation zone that is greater than a sum area of said plurality of main p-n junctions.

5. A diode as claimed in claim 4, wherein said plurality of impurity doped regions have substantially the same shape.

6. A diode as claimed in claim 4, wherein said plurality of main p-n junctions are arranged in a matrix array.

7. A diode as claimed in claim 4, wherein said plurality of main p-n junctions have a total area that is less than or equal to 4,000 square microns.

8. A diode as claimed in claim 4, wherein each of the said plurality of main p-n junctions has a substantially identical circular plan shape.

9. A diode as claimed in claim 4, wherein heat generation zones of adjacent main p-n junctions overlap each other.

10. A diode as claimed in claim 4, wherein each of said plurality of main p-n junctions has a diameter, and adjacent main p-n junctions are separated from each other by a distance that is equal to said diameter.

11. A low-noise Zener diode comprising:

a semiconductor substrate of a first conductivity type;

a semiconductor layer of said first conductivity type formed on said substrate, said layer being lower in doping concentration than said substrate;

a first impurity doped region of a second conductivity type opposite to said first conductivity type formed in a surface area of said layer, said first impurity doped region having a depth less than a thickness of said layer;

a plurality of second impurity doped regions of said second conductivity type formed to vertically penetrate said first impurity doped region and said layer, each of said plurality of second impurity doped regions having a top exposed from said first impurity doped region and a bottom contacted with said substrate;

said plurality of second impurity doped regions producing a plurality of main p-n junctions at interfaces of said plurality of second impurity doped regions and said substrate;

a first electrode electrically connected to said plurality of second impurity doped regions; and a second electrode electrically connected to said substrate;

wherein heat generation zones of said plurality of main p-n junctions are combined with each other to produce a total heat generation zone that is greater than a sum area of said plurality of main p-n junctions.

12. A diode as claimed in claim 11, wherein each of said plurality of second impurity doped regions has an approximately tubular shape that extends vertically.

13. A diode as claimed in claim 11, wherein said plurality of second impurity doped regions are arranged in a matrix array at intervals.

14. A low-noise Zener diode comprising:

a semiconductor substrate of a first conductivity type;

a semiconductor layer of said first conductivity type formed on said substrate, said layer being lower in doping concentration that said substrate;

a plurality of impurity doped regions of a second conductivity type opposite to a first conductivity type, said plurality of impurity doped regions being formed to vertically penetrate said layer;

each of said plurality of impurity doped regions having a top exposed from said layer and a bottom contacted with said substrate;

said plurality of said second impurity doped regions being arranged apart from each other for producing a plurality of main p-n junctions of said diode in a depth level at respective interfaces of said plurality if impurity doped regions and said substrate;

a first electrode electrically connected to said plurality of second impurity doped regions; and a second electrode electrically connected to said substrate;

wherein heat generation zones of said plurality of main p-n junctions are combined with each other to produce a total heat generation zone that is greater than a sum area of said plurality of main p-n junctions.

15. A diode as claimed in claim 14, wherein said plurality of impurity doped regions have substantially the same shape.

16. A diode as claimed in claim 14, wherein said plurality of main p-n junctions are arranged in a matrix array.

* * * * *

UNITED STATES PATENT AND TRADEMARK OFFICE
CERTIFICATE OF CORRECTION

PATENT NO. : 5,612,568
DATED : March 18, 1997
INVENTOR(S) : Takao Arai

It is certified that error appears in the above-indentified patent and that said Letters Patent is hereby corrected as shown below:

Claim 14, Column 12, Line 14, "that" should be --than--.

Claim 14, Column 12, Line 26, "if" should be --of--.

Signed and Sealed this

Eighth Day of July, 1997

Attest:

BRUCE LEHMAN

Attesting Officer

Commissioner of Patents and Trademarks